United States Patent
Bhatt et al.

(10) Patent No.: US 6,221,694 B1
(45) Date of Patent: Apr. 24, 2001

(54) METHOD OF MAKING A CIRCUITIZED SUBSTRATE WITH AN APERTURE

(75) Inventors: Anilkumar C. Bhatt, Johnson; Michael J. Cummings, Vestal; Thomas R. Miller, Endwell; Kristen A. Stauffer; Michael Wozniak, both of Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,080

(22) Filed: Jun. 29, 1999

(51) Int. Cl.$^7$ .................................................. H01L 21/44
(52) U.S. Cl. ............................................................ 438/122
(58) Field of Search ..................................... 438/121, 122, 438/118, 119, 125, 120

(56) References Cited

U.S. PATENT DOCUMENTS

| | | | |
|---|---|---|---|
| 5,022,960 | 6/1991 | Takeyama et al. | 156/643 |
| 5,072,283 | 12/1991 | Bolger | 357/72 |
| 5,081,563 | 1/1992 | Feng et al. | 361/414 |
| 5,142,448 | 8/1992 | Kober et al. | 361/398 |
| 5,144,534 | 9/1992 | Kober | 361/398 |
| 5,288,542 | 2/1994 | Cibulsky et al. | 428/209 |
| 5,367,435 | * 11/1994 | Androd et al. | 361/749 |
| 5,384,689 | 1/1995 | Shen | 361/761 |
| 5,542,175 | 8/1996 | Bhatt et al. | 29/846 |
| 5,599,747 | * 2/1997 | Bhatt et al. | 438/118 |
| 5,648,890 | 7/1997 | Loo et al. | 361/704 |
| 5,666,448 | 9/1997 | Schoenwald et al. | 385/44 |
| 5,729,050 | 3/1998 | Kim | 257/667 |
| 5,759,047 | * 6/1998 | Brodsky et al. | 439/66 |
| 5,798,909 | 8/1998 | Bhatt et al. | 361/764 |

FOREIGN PATENT DOCUMENTS

| | | |
|---|---|---|
| 0 597 144 A1 | 11/1992 | (EP) . |
| 61-198656 | 9/1986 | (JP) . |
| 63-009137 | 1/1988 | (JP) . |
| 7-321140 | 12/1995 | (JP) . |

\* cited by examiner

Primary Examiner—David Nelms
Assistant Examiner—David Nhu
(74) Attorney, Agent, or Firm—Scully, Scott, Murphy & Presser; Lawrence R. Fraley

(57) ABSTRACT

A method of making a circuitized substrate which may be utilized as a chip carrier structure. The method involves the steps of providing a dielectric member and routing out a preselected portion of the base member to form an aperture. Metallization of the dielectric member and the walls of the aperture then occurs, followed by circuitization of the surfaces of the dielectric member. Direct metallization of the aperture walls eliminates many manufacturing steps previously required to metallize the aperture walls.

13 Claims, 14 Drawing Sheets

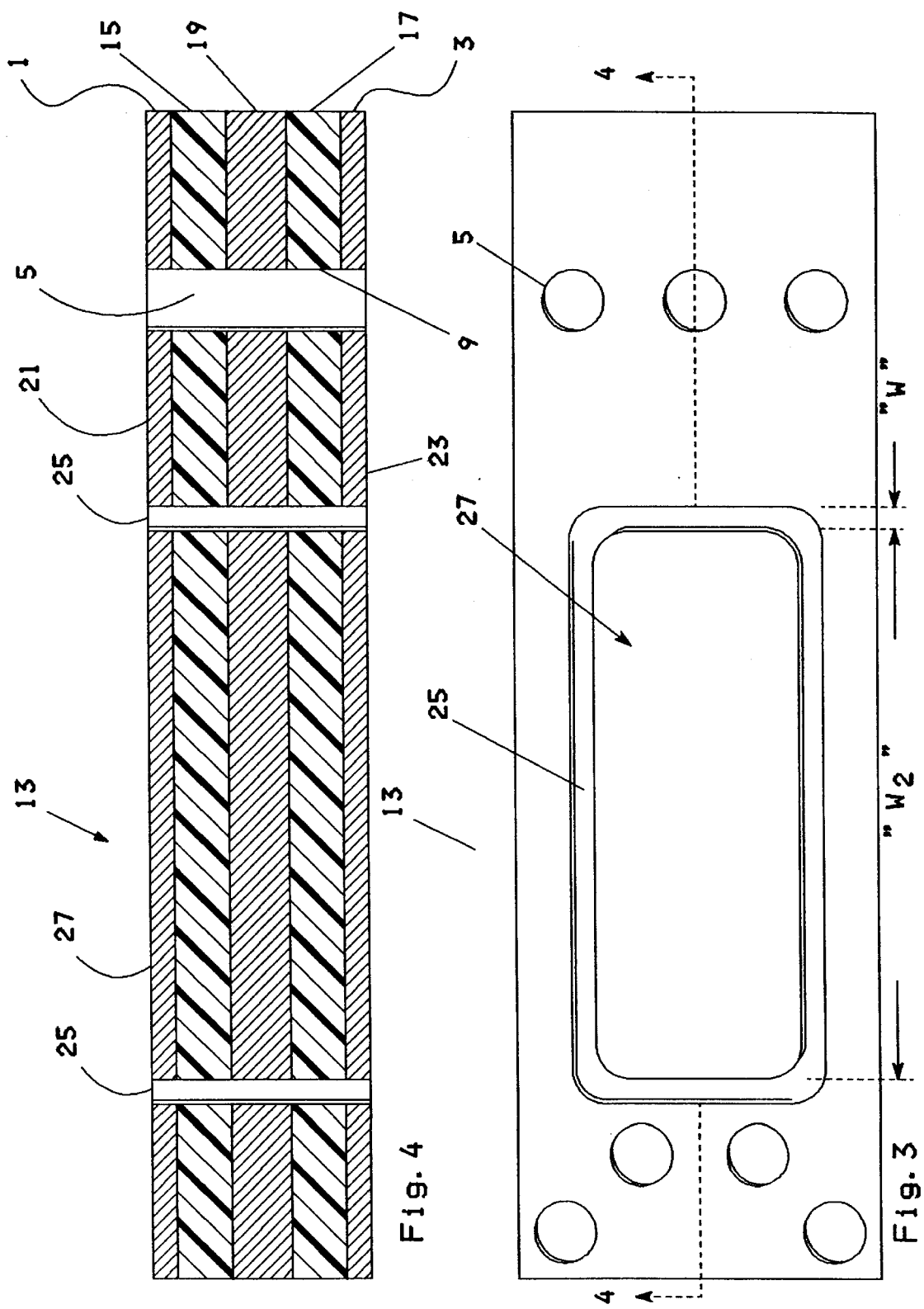

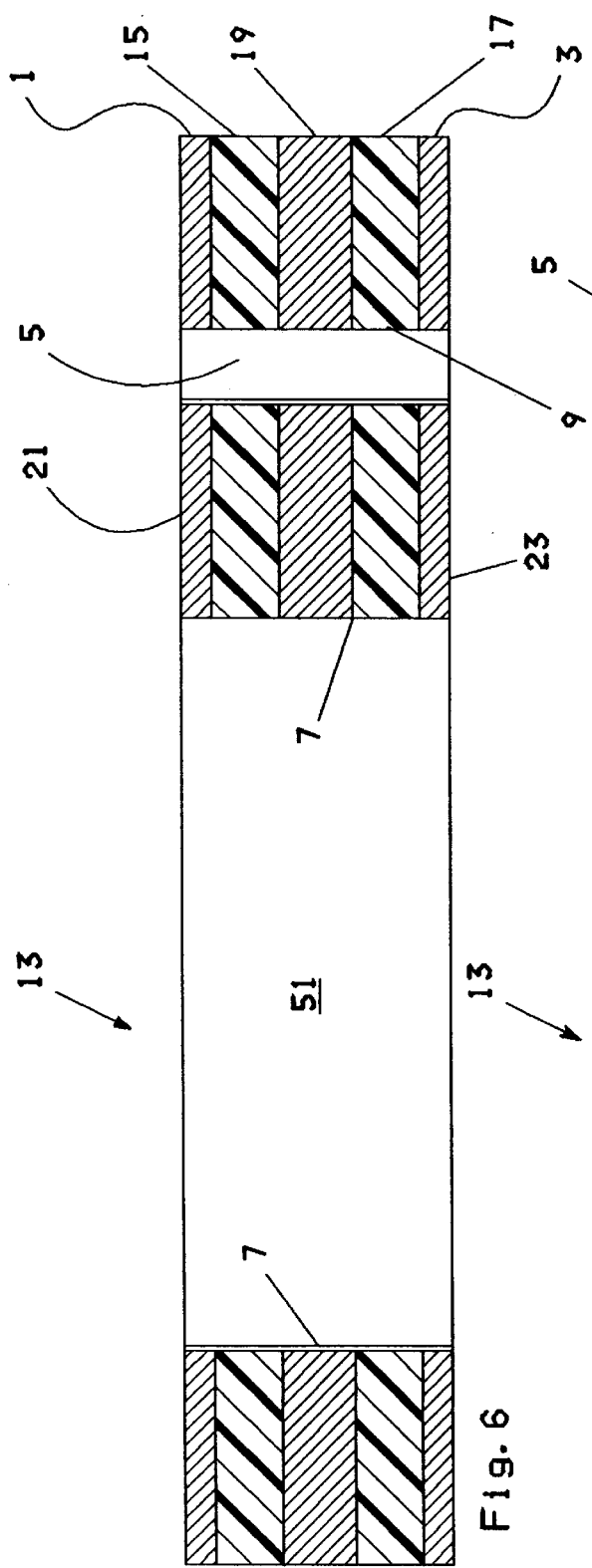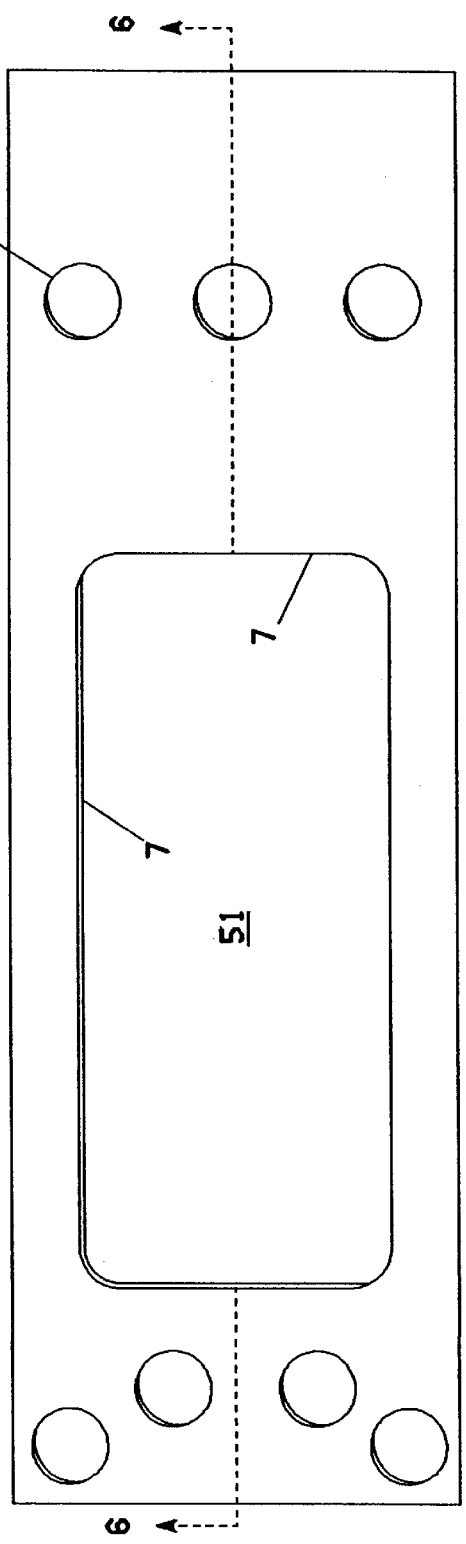

METHOD OF MAKING A CIRCUITIZED SUBSTRATE WITH AN APERTURE

TECHNICAL FIELD

The invention pertains generally to circuitized substrates and particularly to chip carriers for integrated circuits.

BACKGROUND OF THE INVENTION

Integrated circuit devices (hereinafter referred to as chips) having high performance are typically electronically packaged by mounting one or more chips onto a ceramic, e.g., alumina, circuitized substrate (referred to as a chip carrier) and using wire bonds to electrically connect I/O (input/output) contact pads on each chip to corresponding contact pads (and therefore to corresponding fan-out circuitry) on the circuitized chip carrier substrate. Wire bonding is a well known process in the art and further description is not believed necessary. The resulting chip carrier is then typically mounted on a printed circuit board (PCB) and, using circuitry on the PCB, electrically coupled to other such chip carriers and/or other electronic components mounted on the PCB.

While ceramic chip carrier structures have proven extremely useful in the electronic packaging field, the use of ceramic as the dielectric material of the substrate does present certain limitations and drawbacks. For example, the speed of propagation of an electrical signal through a conductive wire located on a dielectric layer (or between two dielectric layers for that matter) is proportional to the inverse of the square root of the dielectric constant of the dielectric material layer or layers. As is known, the dielectric constants of most ceramics are relatively large, e.g., the dielectric constant of alumina (the primary constituent of ceramic materials used in these substrates) is relatively high, which results in ceramic chip carriers exhibiting relatively low signal propagation speeds in comparison to substrates of other (e.g., organic) materials, such as fiberglass-reinforced epoxy resin, polytetrafluoroethylene, etc.

Utilization of ceramic chip carrier substrates also presents certain I/O constraints. For example, a single-layer ceramic chip carrier substrate includes but a single layer of fan-out circuitry on the upper surface of the ceramic substrate, extending to contact pads around the outer periphery of the substrate. A lead frame having inner leads connected to these peripheral contact pads, is typically used to electrically connect such a ceramic chip carrier to a PCB. As the number of chip I/Os has increased (in response to more recent enhanced design requirements), it has been necessary to increase the wiring density, sometimes to the point where undesirable cross-talk between adjacent wires may occur. Further, it has become increasingly difficult, if not impossible, to form a correspondingly large number of contact pads around the outer periphery of the ceramic substrate. Accordingly, it is understood that single-layer ceramic chip carrier substrates are limited in the ability thereof to accommodate semiconductor chips with significantly increased I/O counts as demanded in many of today's designs.

Various efforts to accommodate chips having relatively large numbers of I/O pads have led to the use of multilayer ceramic chip carrier substrates utilizing what are referred to as "ball grid arrays" (BGAs) in lieu of lead frames. Such multilayer types of ceramic chip carrier substrates differ from single-layer ceramic chip carrier substrates in that these include two or more layers of fan-out circuitry on two or more ceramic layers. Significantly, these layers of fan-out circuitry are electrically interconnected by mechanically drilled holes (called "vias"), which are plated and/or filled with electrically conductive material (e.g., copper). In addition, a certain number of such holes extend from the layers of fan-out circuitry to respective lands on the chip carrier substrates, on which are mounted solder balls (formed in grid arrays, hence the term "ball grid array"). These solder balls are intended to be mechanically and electrically connected to corresponding solderable contact pads on a receiving substrate, e.g., PCB. Unfortunately, the mechanically drilled holes electrically interconnecting the layers of fan-out circuitry have relatively large diameters, requiring the spacing between the fan-out wires to be relatively large. This relatively large spacing between fan-out wires understandably limits the number of chip I/O pads which can be accommodated by such multilayered substrates.

Other attempts to package chips having a relatively large number of chip I/O pads have led to the use of multi-tiered cavities in multi-layered ceramic substrates. (As used herein, the term "cavity" denotes a depression in a substrate, not a hole or opening extending entirely through the substrate's thickness.) When using such a packaging configuration, a chip is mounted face-up (its I/O pads facing upwardly) at the bottom of a multi-tiered cavity. Wire bonds (e.g., using fine gold wire) are extended from the I/O contact pads on the exposed upper surface of the chip to respective contact pads on the exposed upper surfaces of the different layers of the multi-layered ceramic substrate. While this configuration does make it possible to accommodate a relatively large number of chip I/O pads, it unfortunately typically mandates usage of multiple manufacturing set-up operations to accommodate the different tier height for the relatively long wire bonds extending from the chip to the tiers of the multi-tiered cavity.

Ceramic chip carrier substrates are also limited in heat dissipation capabilities. For example, in the case of a multilayer ceramic chip carrier having a chip positioned at the bottom of a multi-tiered cavity, heat dissipation is typically achieved by providing a heat sink directly beneath the cavity. This implies, however, that the heat generated by the chip must necessarily be conducted through the ceramic layer at the bottom of the cavity before reaching the heat sink. As a consequence, the rate of heat dissipation is limited.

As defined herein, the present invention teaches a method for making a circuitized substrate capable of overcoming the aforementioned drawbacks of other such products. This method is uniquely adaptable for use with many existing manufacturing apparatus (e.g., wire bond and photoimaging equipment) without extensive alteration thereof and can thus be used on a mass production basis to enjoy the benefits thereof.

Various methods for making circuitized substrates are described in U.S. Pat. No. 5,022,960 (Takeyama et al), U.S. Pat. No. 5,142,448 (Kober et al), U.S. Pat. No. 5,144,534 (Kober) and U.S. Pat. No. 5,288,542 (Cibulsky et al). In U.S. Pat. No. 5,022,960, a laser beam is used to remove a selected portion of a substrate (12) which eventually accommodates a semiconductor chip (20) positioned on a metal layer (11) also attached to the substrate. In U.S. Pat. No. 5,142,448, there is described the step of compression molding several dielectric layers to form a laminate. Flexibility of certain parts of the board is attained by provision of slots, and a "plug" is located for occupying the defined flexible region. In U.S. Pat. No. 5,144,534, a method of making rigid-flexible circuit boards is described in which a removable plug is used in the PCB during processing and then removed. Finally, in U.S. Pat. No. 5,288,542 (assigned to the same assignees as the present Application), another method is described for making a rigid-flexible circuit board in which a release layer (6) is used during processing and subsequently removed.

In addition to the above, attention is directed to the following patents assigned to the same assignee as the present invention.

In U.S. Pat. No. 5,542,175, entitled "Method Of Laminating And Circuitizing Substrates Having Openings Therein", filed Dec. 20, 1994, there is defined a method of laminating two substrates and circuitizing at least one of these. A plug is provided and shaped to fit within an opening defined in the structure, and then removed following lamination and circuitization.

In U.S. Pat. No. 5,798,909, entitled "Organic Chip Carriers For Wire Bond-Type Chips", filed Feb. 15, 1995, there is defined a chip carrier having a single-tiered cavity within a dual layered (of organic material) substrate and a semiconductor chip located in the cavity. The chip is wire bonded to circuitry on the substrate. The method claimed in the present Application may be used to make a chip carrier of the type defined in U.S. Pat. No. 5,798,909.

In U.S. Pat. No. 5,566,448, entitled "Method Of Construction Of Multi-Tiered Cavities Used In Laminate Carriers", filed Jun. 26, 1995, there is defined a method of forming a chip module wherein a rigid cap and substrate are used, the cap and substrate laminated together with bond pads connected to circuitry disposed in a bottomed cavity of the cap. Following cap circuitization, part of the cap (that over the cavity) is removed and a semiconductor chip coupled to the circuitry.

In U.S. Pat. No. 5,599,747, entitled "Method Of Making A Circuitized Substrate With An Aperture", filed Jun. 27, 1995, there is defined a method of providing a dielectric member and partially routing this member to define a temporary support portion therein. Metallization and circuitization then occur, following which the temporary support portion is removed. This temporary support thus assures effective support for the photoresist used a part of the circuitization process. Thus, the photoresist is capable of being applied in sheetlike form for spanning the relatively small openings of the dielectric without sagging, bowing, etc., which may adversely impact subsequent processing steps.

The teachings of U.S. Pat. Nos. 5,542,175, 5,798,909, 5,566,448 and 5,599,747 are hereby incorporated herein by reference.

As defined herein, the present invention defines a method that results in a circuitized substrate capable of: (1) exhibiting relatively high electrical signal propagation speeds; (2) accommodating relatively high I/O chips; (3) exhibiting relatively short "time of flight" electrical signal speeds; and (4) exhibiting a relatively high rate of heat dissipation.

OBJECTS AND SUMMARY OF THE INVENTION

It is, therefore, an object of this invention to provide a method of making a circuitized substrate capable of being used as a chip carrier assembly which can be performed in a facile and relatively inexpensive manner in comparison to existing carrier manufacturing processes.

It is a more particular object of the invention to provide such a process which is readily adaptable to existing manufacturing equipment without extensive modification thereof.

In accordance with one aspect of this invention, there is defined a method of making a circuitized substrate, the method comprising the steps of providing an electrically insulative base member having first and second surfaces and removing a preselected portion of the base member to form at least one aperture having at least one sidewall and extending entirely through the base member. This aperture may serve to accommodate a chip. The method, as defined, further includes applying a first electrically conductive layer onto the first and second surfaces of the base member, including on at least one sidewall of the aperture, and then applying a second electrically conductive layer onto the first electrically conductive layer to substantially cover the first conductive layer. The method still further includes applying a photoimaging material onto the second conductive layer, then exposing and developing selected portions of the photoimaging material to define a pattern within the photoimaging material on the second conductive layer. The method even further includes circuitizing the second conductive layer and then removing the photoimaging material from the second conductive layer.

BRIEF DESCRIPTION OF THE DRAWINGS

FIGS. 1–14 represent the various steps of making a circuitized substrate in accordance with a preferred embodiment of the invention.

BEST MODE FOR CARRYING OUT THE INVENTION

For a better understanding of the present invention, together with other and further objects, advantages and capabilities thereof, reference is made to the following disclosure and appended claims in connection with the above-described drawings.

The invention defines a method of making a circuitized substrate (and the resulting chip carrier) in which the chip carrier is particularly designed to accommodate wire bond-type chips. In addition to other advantageous features, the carrier produced in accordance with the teachings herein is capable of: (1) exhibiting relatively high electrical signal propagation speeds; (2) accommodating relatively high I/O chips; (3) avoiding the need for multiple manufacturing set-up operations heretofore associated with multi-tiered wire bond packages (as well as achieving a relatively short "time of flight" for electrical signals propagating through the wire bonds); and (4) assuring a relatively high rate of heat dissipation. In particular, the chip carrier produced in accordance with the preferred method taught herein achieves relatively high electrical propagation speeds because it employs organic materials, such as fiberglass-reinforced epoxy resins (in the trade also referred to as "FR4"), polytetrafluoroethylene (e.g., Teflon), etc. in lieu of ceramic materials. (Teflon is a trademark of E. I. Dupont deNemours & Company.) The resulting chip carrier also accommodates relatively high I/O count chips because it uses at least one organic photoimageable dielectric layer in which photo-vias may be formed to electrically interconnect two (or more) layers of fan-out circuitry. The resulting chip carrier achieves a relatively short "time of flight" for electrical signals propagating through the wire bonds. The invention may further provide enhanced heat sinking for such a structure through the attachment of a solid heat conductor (e.g., copper sheet) to one side of the substrate and placement of the chip (or chips) in thermal contact therewith.

Figure 1:
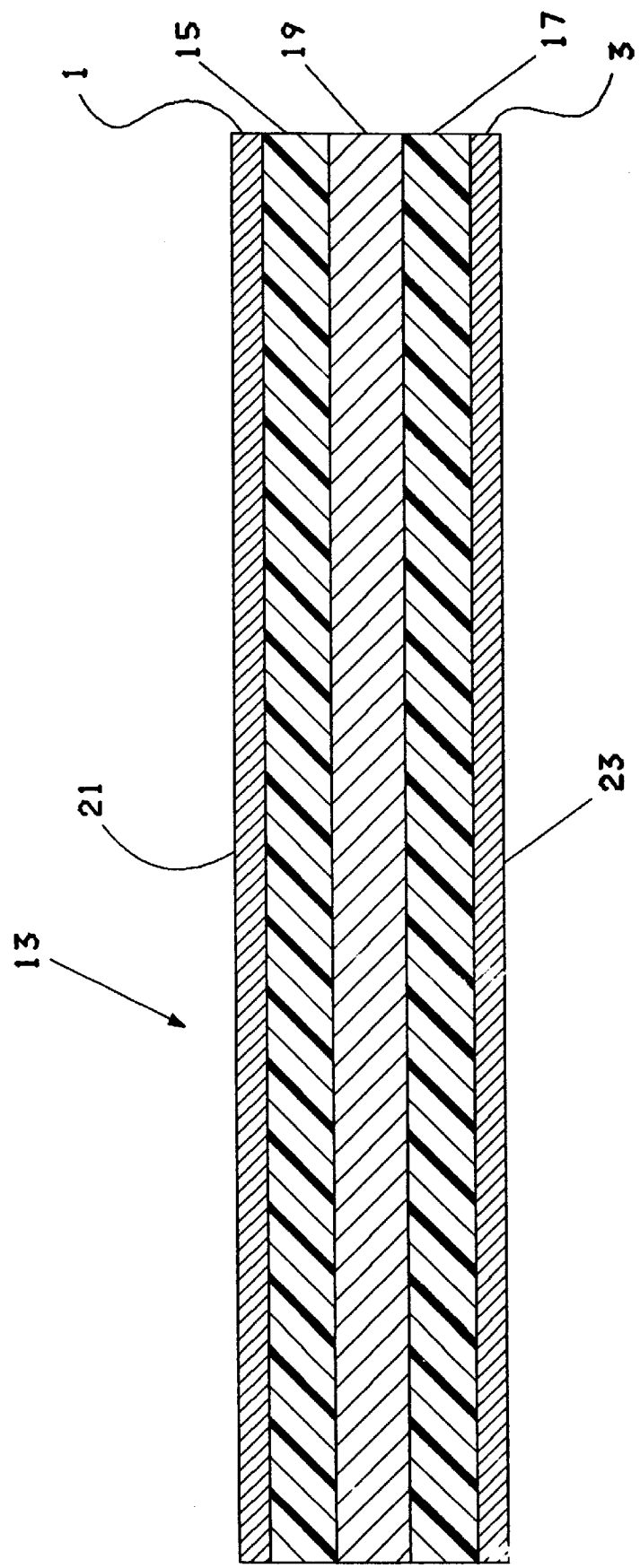

In FIG. 1, there is shown an electrically insulative base member 13 which may be used in the present invention to produce a chip carrier product (shown in FIG. 16 and described below). It is understood that the invention is not limited to the particular configuration shown in FIG. 1, as others are readily possible. Base member 13 includes first and second conductive layers 1 and 3, which sandwich therebetween, first and second dielectric layers 15 and 17 and conductive plane 19. In a preferred embodiment, each of the two conductive layers is comprised of copper or a well known conductive material having a thickness from about 0.25 mils (0.0025 inches) to about 1.5 mils with the thickness of each preferably being about 0.75 mils. Each of the two dielectric layers is comprised of fiberglass reinforced epoxy resin (FR4) and each possess a thickness of from about 2 mils to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

Sandwiched between dielectric layers 15 and 17 is the conductive plane 19, preferably of copper or other well-known conductive material and possessing a thickness of preferably within the range of about 0.125 mils to about 2.5 mils. The thicknesses for plane 19 of less than about 0.125 mils may prove undesirable should the resulting structure by subjected to relatively high temperatures. Additionally, thicknesses greater than about 2.5 mils may prove undesirable because of the additional time necessary to form such layers using conventional plating techniques and associated difficulties with line width control. The resulting structure shown in FIG. 1 thus preferably possesses a thickness within the range of about 4.7 mils to about 44 mils. More preferably, a thickness of about 24.8 mils is used.

Conductive layers 1 and 3 and dielectric layers 15 and 17 are bonded to the conductive plane 19 using a lamination process, such a process known in the art and further description is not believed necessary. Base member 13 is thus shown to include at least two surfaces, a first surface 21, and a second surface 23.

Although two external conductive layers and two dielectric layers are shown for base member 13, it is understood that the invention is not limited thereto. Specifically, it is only necessary to provide one such conductive layer and one such dielectric layer while still attaining the advantageous results taught herein. At least two layers of each are used when it is desired to incorporate an internal conductive plane (e.g., power, ground or signal) as part of the final structure. Understandably, several conductive dielectric layers and corresponding internal conductive planes may be utilized, depending on operational requirements for the finished product.

Figure 2:
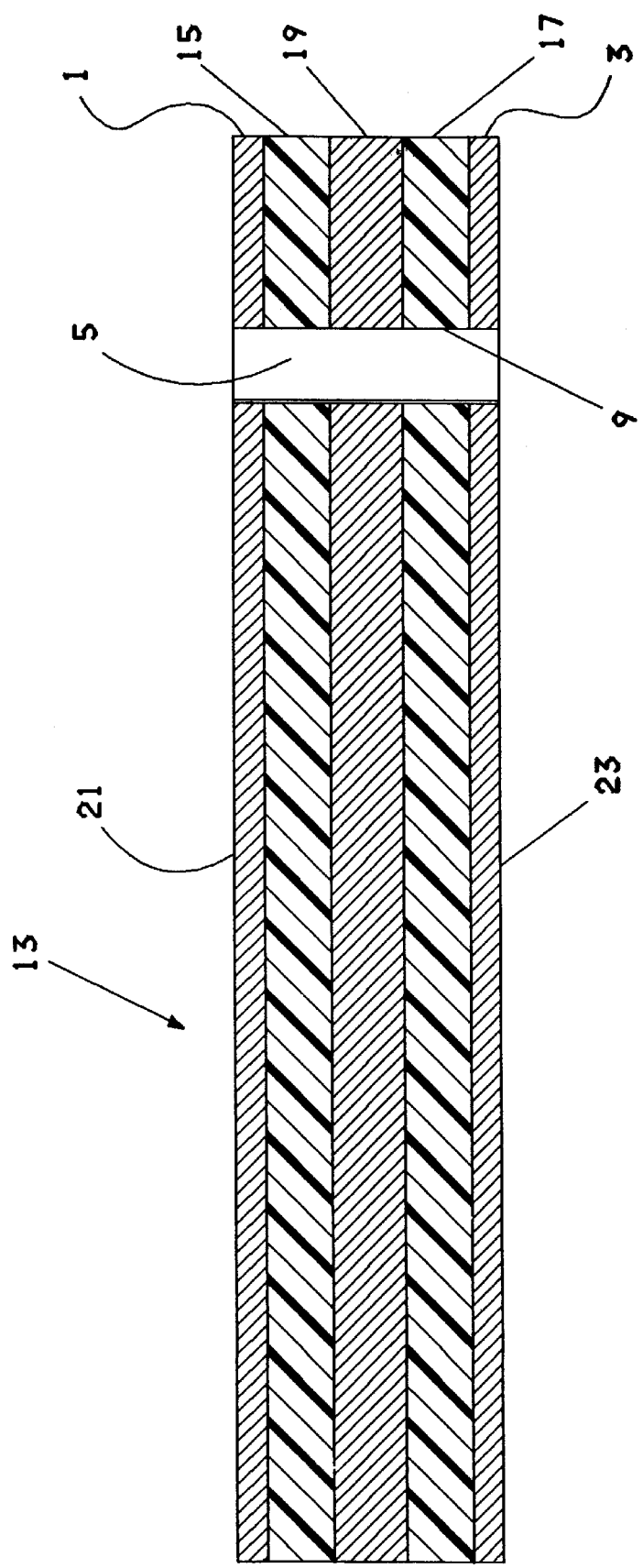

In FIG. 2, opening 5 having an internal wall 9 is formed substantially through base member 13. Although only one opening is shown, it is understood that multiple openings may be formed, depending on the ultimate electrical requirements of the circuitized substrate. Opening 5, preferably a hole, may be formed by mechanical drilling, although other hole forming techniques such as punching and laser drilling can be used. Opening 5 is formed with a diameter of about 6 mils to about 14 mils, preferably about 8 mils.

In FIG. 3 (a plan view of the base member 13 of FIG. 2), a substantially rectangular shaped slot 25 is formed within member 13. As understood, this slot serves to substantially define the ultimate boundaries of an opening (described below) to be provided in member 13 such that the member can accommodate a chip positioned within this opening and electrically coupled to circuitry (described below) of member 13. As seen in FIG. 3, this slot 25 defines a substantially rectangular portion 27 within base member 13 which will subsequently be removed.

Although a substantially rectangular shape is shown for portion 27 in the plan view of FIG. 3, other shapes are readily possible, depending on the ultimate chip configuration and the method of coupling this chip to base member 13. In one example, the resulting aperture (51, FIGS. 8 and 9) left after removal of portion 27 possessed width and length dimensions each within the range of about 500 to about 700 mils, with slot 25 possessing an average width ("W" in FIG. 3) of about 60 mils.

The preferred means for providing slot 25 is to use a routing process using equipment known in the art, further description thus not believed necessary. In one embodiment, the portion 27 to be removed possessed a width ("W2" in FIG. 3) of only about 40 mils.

In FIG. 4, a cross-sectional view along plane 4—4 of the base member 13 of FIG. 3 is shown. Slot 25, formed by routing portion 27, in base member 13 is also shown.

In FIG. 5, base member 13 is illustrated with portion 27 removed, leaving an aperture 51 having sidewalls 7 defined by previously routed slots 25. FIG. 6 is a cross-sectional view along plane 6—6 of the base member 13 of FIG. 5, also illustrating aperture 51 with sidewalls 7.

Figure 7:
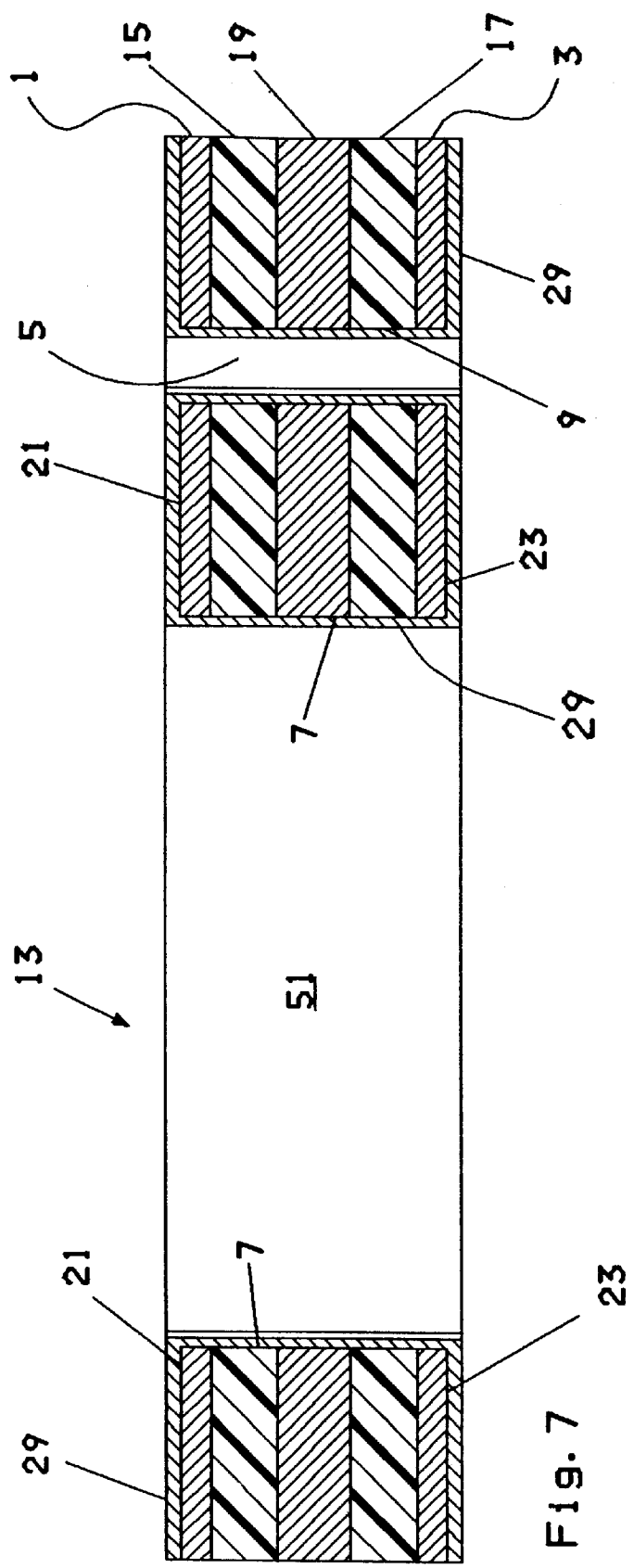

In the next step (FIG. 7), it is preferred to provide a first electrically conductive layer 29 on the surfaces 21 and 23 of base member 13, on the sidewalls 7 of opening 51 and on internal wall 9 of opening 5. As seen in FIG. 7, this conductive layer 29 substantially covers the entire thickness of base member 13 in aperture 51 and in hole 5. The preferred material for the conductive layer 29 is a palladium-tin seed. Understandably, the described seed layer serves to enhance subsequent positioning of the invention's conductive circuitry (described below). The seed layer is comprised of particles of palladium-tin and is substantially continuous; however, space between particles comprising this layer may exist.

Figure 8:
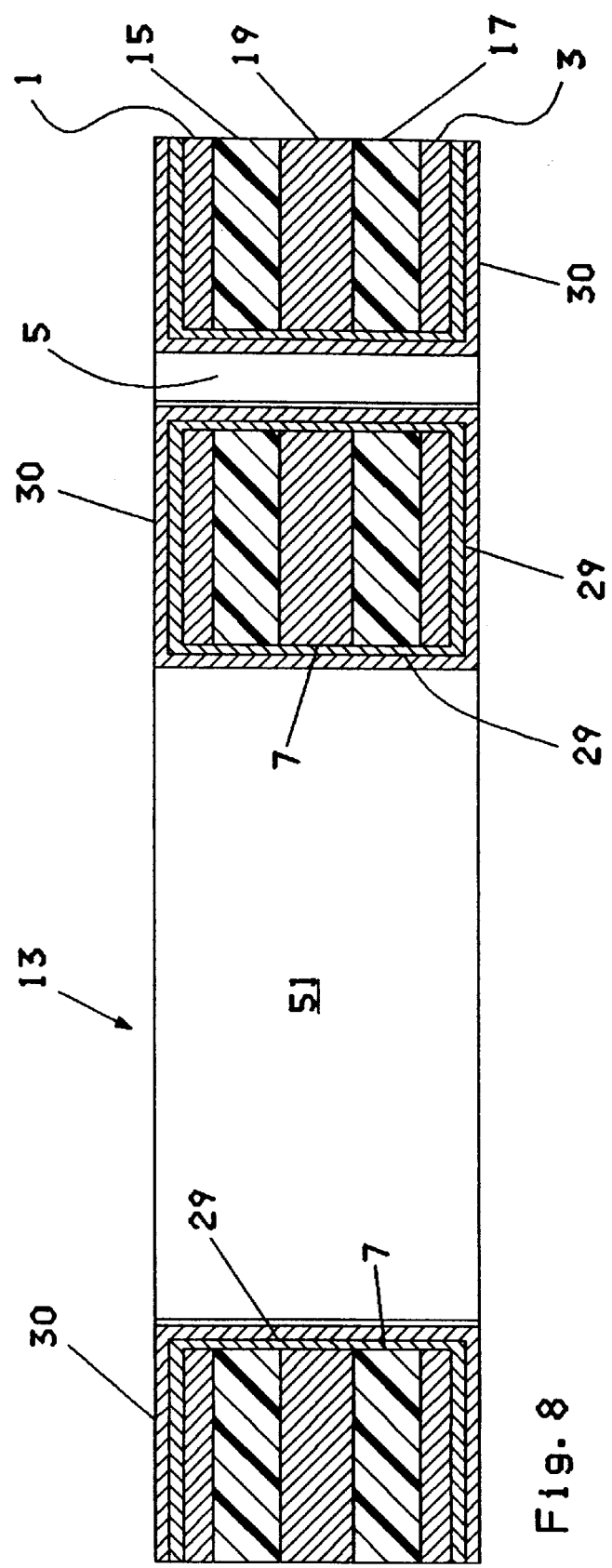

In FIG. 8, a second electrically conductive layer 30 is applied onto substantially the entire first electrically conductive layer 29 of base member 13. The second electrically conductive layer 30 covers the first electrically conductive layer on the sidewalls 7 of aperture 51 and the internal wall 9 of opening 5. The second electrically conductive layer of FIG. 8 may be applied by plating or by any other suitable known technique, preferably by electroless plating. The second electrically conductive layer 30 may be comprised of nickel, aluminum, or copper, but is preferably copper. The thickness of the second electrically conductive layer may be from about 0.3 mils to about 1.5 mils, preferably from about 0.9 mils to about 1.2 mils.

Figure 9:
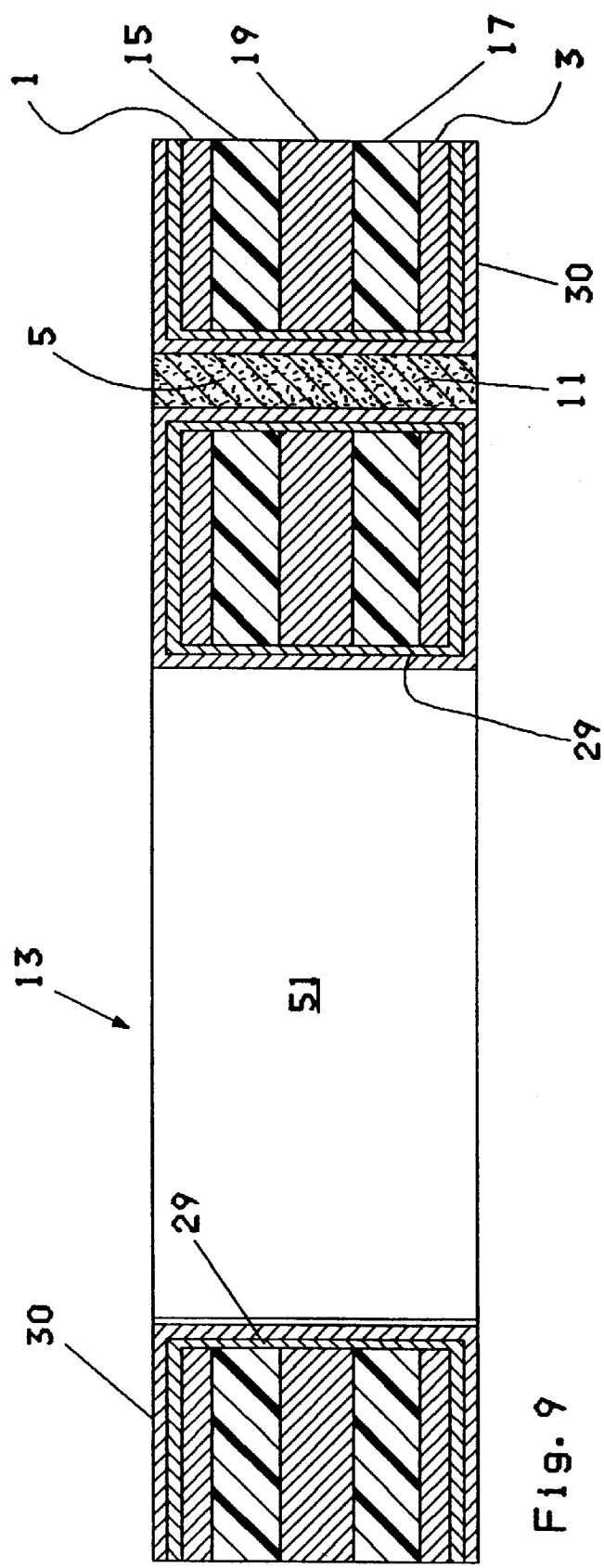

An important aspect of this invention includes the forming of at least one filled electrically conductive opening 5 adjacent the opening formed by routing. This allows the circuitized substrate with many multiple layers to easily communicate through the electrically conductive opening. As previously described, opening 5 can have a diameter, before application of the first electrically conductive layer on the internal wall, of about 6 mils to about 14 mils. After application of the second electrically conductive layer the diameter is reduced to about 5 mils from about 13 mils, and can be as small as about 4 mils to about 12 mils. Since the subsequently described circuitization technique involves etching, there is a need to protect the second conductive layer on the internal wall of the opening. This cannot be done in such a small hole using conventional photolithographic techniques. It is therefore necessary to substantially fill the openings with a permanent material to protect the internal wall of the opening. FIG. 9 illustrates the resultant structure after substantially filling opening 5 with a permanent material 11. The opening is filled such that the external surfaces of the filled opening are substantially planar with the second conductive layer 30 on the base member 13, yielding a planar surface for subsequent photolithographic processing (described below). Filling opening 5 with material 11 is performed using a material which has a coefficient of thermal expansion, after curing, closely matched to the coefficient of thermal expansion of the printed circuit board substrate. The fill material can be either conductive or non-conductive, and is compatible with all wet processes (metal plating, etching, photo-processing, etc.). Preferred fill materials are those containing particulates or fillers in a resin binder. The binder can be any of the epoxy/resin systems used in printed circuit board manufacture. The particulate fill can be carbon, silica or metal powders. In one example of the invention, a fill material of approximately 75% to about 90% weight percent of copper particulates in an epoxy resin binder was used.

As mentioned above, a key attribute of the present invention is its adaptability to many existing technologies, e.g., those used in mass production, by allowing the invention as defined herein to benefit from the several advantages thereof. One particular process involves what is referred to as a liquid resist operation in which the photoresists used are applied in liquid form. Such an operation may be used in the present invention, as defined immediately below.

Figure 10:
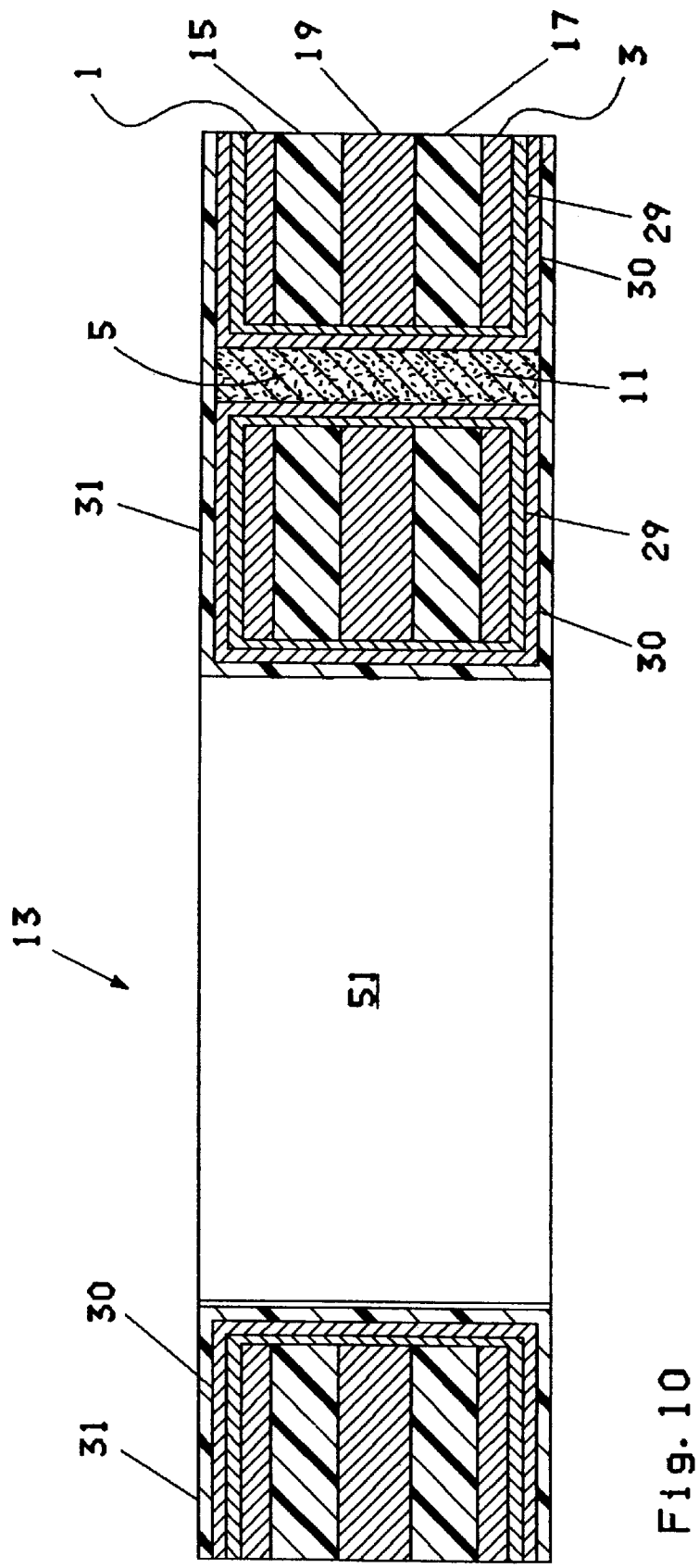

In FIG. 10, a layer of such a photoimaging (photoresist) material 31 is shown as being applied on the respective surfaces of member 13. In one example, the layer of photoresist possessed a thickness of from about 0.6 mils to about 2.0 mils. A preferred material is a negative-acting photoresist, various examples being known in the art, including Photoresist 3120 available from the E. I. duPont deNemours & Company under this product name. Negative-acting photoresists, when applied and exposed through a suitable photomask, undergo a physical and chemical change in the exposed areas that render these areas insoluble to the subsequent developing solution which is to be applied thereto. Following exposure, the resist-coated base member 13 is immersed in developing solution (e.g., sodium carbonate or propylene carbonate), which allows the unexposed areas to be removed without excessive impact on the hardened, exposed area. Baking or other processes may be used to further harden the remaining, exposed portions, if desired.

Significantly, it can be seen that the entire sidewall of aperture 51 covered with the second conductive layer and protected by photoimaging layer 31 will provide (after removal of the photoresist) a complete and uninterrupted conductive layer in aperture 51. Previous techniques to accomplish this required multiple steps to metallize the cavity whereas in the present invention it can be accomplished in only one metallizing step. This is enabled by protection of the entire aperture sidewall with the photoimaging layer during subsequently described etching steps.

Figure 11:
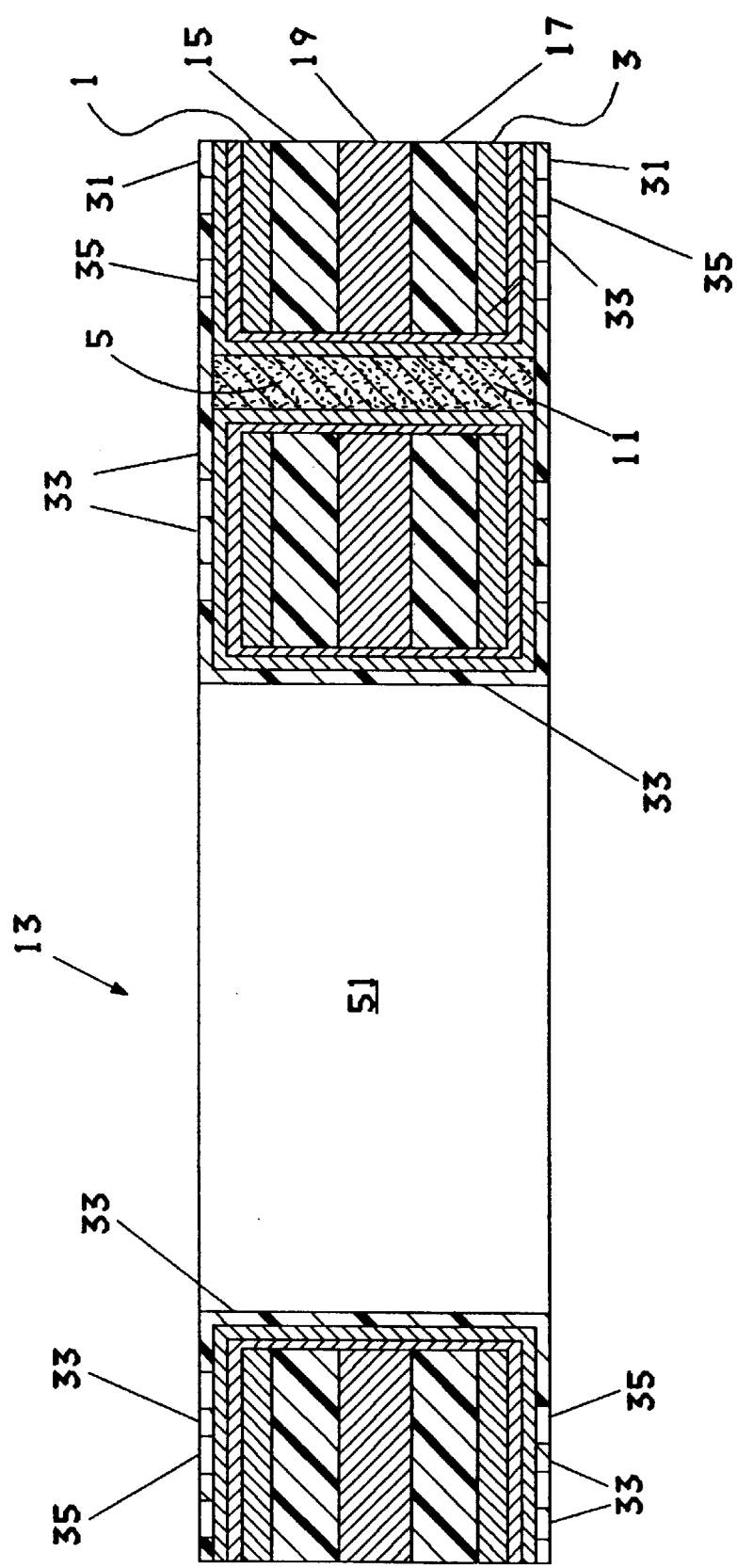

In FIG. 11, base member 13 is shown following the above exposure and removal (developing) operations. As such, only portions of photoresist layer 31 remain. These portions are represented by the numeral 33. It is understood that the removed portions of the photoresist in turn result in openings 35 which, in turn, expose preselected areas on the respective surfaces on which circuitization is to eventually occur. Thus a predetermined pattern on both surfaces is provided.

Although a negative-acting photoresist procedure has been described, the invention is not limited thereto. It is also possible to instead use positive-acting photoresists in which the exposed areas thereof under the photomask, when immersed in the developing solution, are removed. It is thus seen that the present invention is adaptable to more than one accepted technology.

Figure 12:
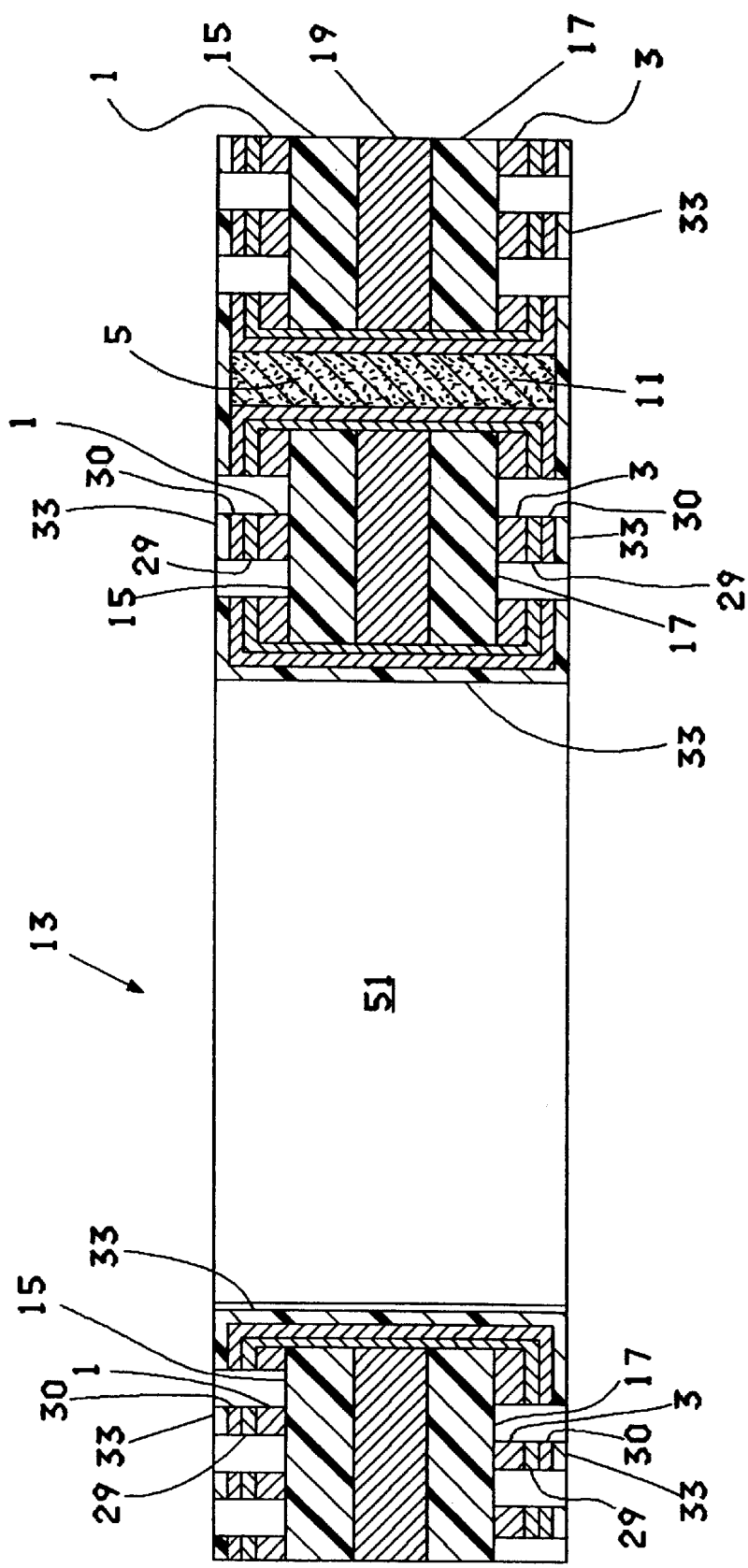

In FIG. 12, member 13 has been subjected to a metallization process in which copper or similarly conductive metal is removed in the exposed portions (e.g., site 35) remaining following photoresist development. In a preferred embodiment, the exposed portions are removed by wet etching. Wet etching can be performed by known techniques in the art, preferably using cupric chloride or ferric chloride. Wet etching is well known in the art and further description is not believed necessary. Wet etching of the exposed areas 35 substantially removes the exposed second electrically conductive layer 30, the first electrically conductive layer 29 directly under the exposed second electrically conductive layer 30, and conductive layers 1 and 3, also directly under the exposed second electrically conductive layer 30, leaving exposed portions of the first dielectric layer 15 and the second dielectric layer 17. Non-exposed portions 33 define a circuitized pattern on first dielectric layer 15 and the second dielectric layer 17.

Figure 13:
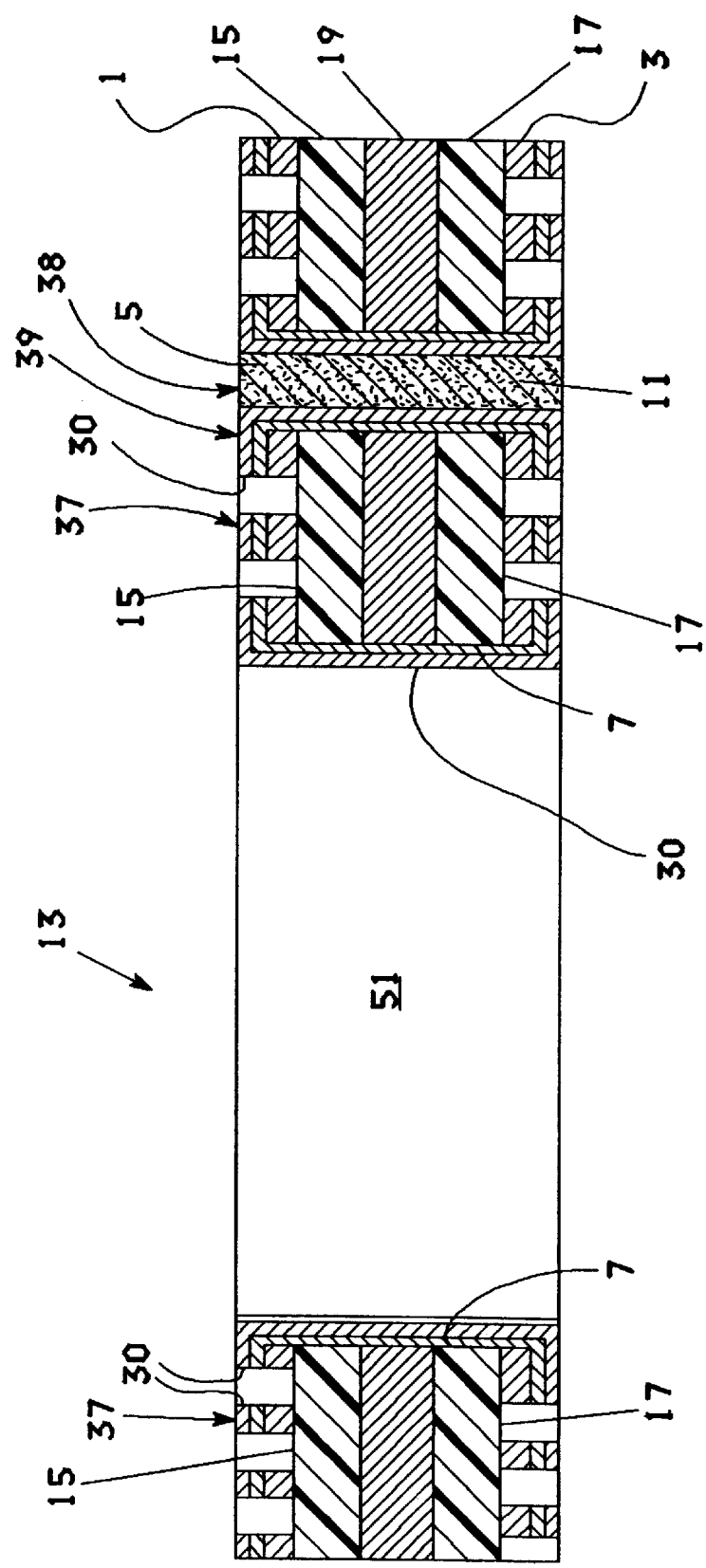

In FIG. 13, portions 33 of photoresist layer 31 are removed, preferably by stripping the photoresist with a suitable solvent known in the art, such as propylene carbonate, sodium carbonate, or sodium hydroxide. Other removal techniques such as laser ablation and mechanical removal or combinations thereof, may also be employed to remove the photoresist layer. In one example, the exposed areas of the second electrically conductive layer 30 on the surfaces of base member 13 serve as one or more contact pad areas 37. In addition to the exposed contact pad areas, it is also possible to expose one or more areas 39 on the surface of the second conductive layer 30 around opening 5, depending on operational requirements for the final product. This area 39 is a land segment and may serve to interconnect upper and lower layers of circuitry and also internal conductive planes such as plane 19, if desired. The exposed areas of the second electrically conductive layer on sidewalls 7 of aperture 51 serve to substantially cover the entire sidewall.

It is understood that the exposed areas illustrated in FIG. 13 are shown for illustration purposes only and do not limit the invention to those as shown. Specifically, in one example of the invention, a total of about 600 pad sites 37 were provided, in addition to about 200 through-hole sites 38.

Figure 14:
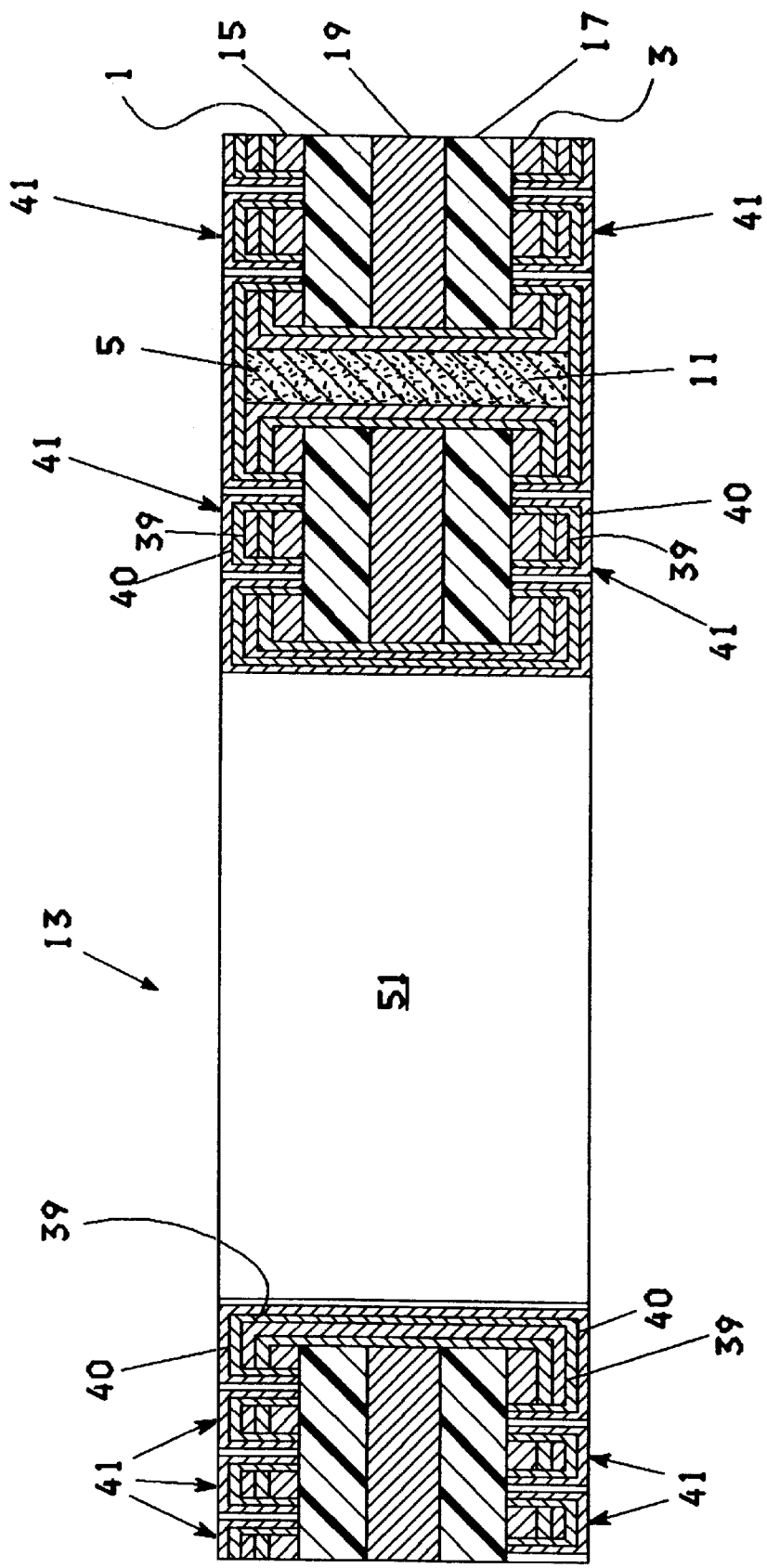

At this point, it may also be desirable to selectively apply precious metal (e.g., gold, nickel or combinations thereof) material to various parts of the respective circuit layers formed on the upper and lower surfaces of member 13 and on the sidewall 7 of aperture 51. Such application is preferably performed by a plating process, several types of which are known in the art. Further description is not believed necessary. Such additional plating is particularly desired for those surfaces of the circuitry designed to receive the highly conductive, fine wires which may eventually couple a chip (described below) to this circuitry. In FIG. 14, the layer of nickel 39 is shown coated with a layer of gold 40 to form conductive members 41.

Figure 15:
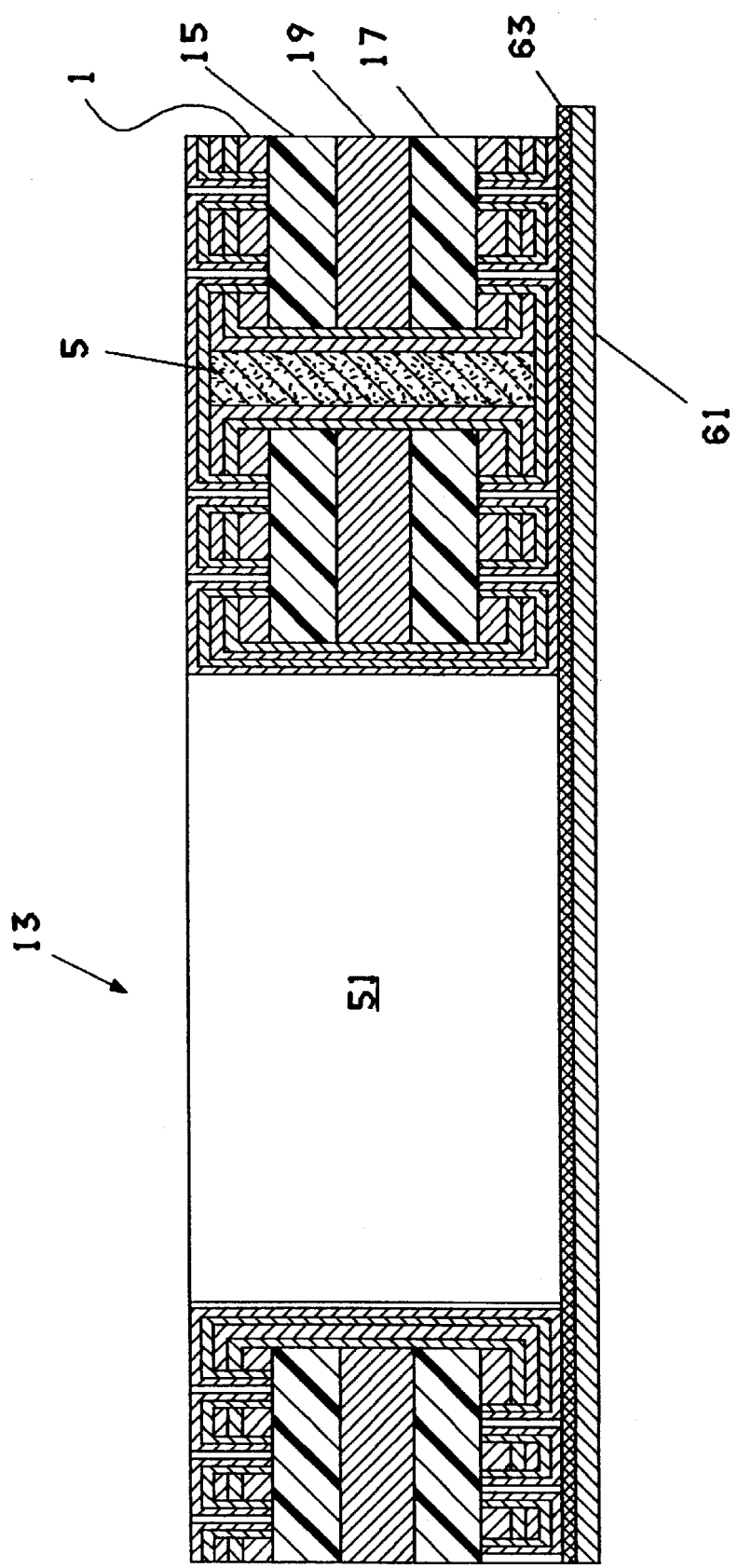
FIGS. 15 and 16 represent additional steps to provide a chip carrier assembly in accordance with a preferred embodiment of the invention.

In the event that it is desired to provide a heat sinking and/or stiffening member, such a member, represented by the numeral 61 in FIG. 15, may be simply bonded to the bottom surface of member 13. In one embodiment, this member 61 was comprised of a 14 mil thick copper sheet which was secured to member 13 using an epoxy-based adhesive, represented by the numeral 63. The heat sink and/or stiffener 61 can be directly attached to the lower surface of dielectric layer 17 or the upper surface of dielectric surface 15 in the case where either lower surface 17 or upper surface 15 are without circuitry.

Figure 16:
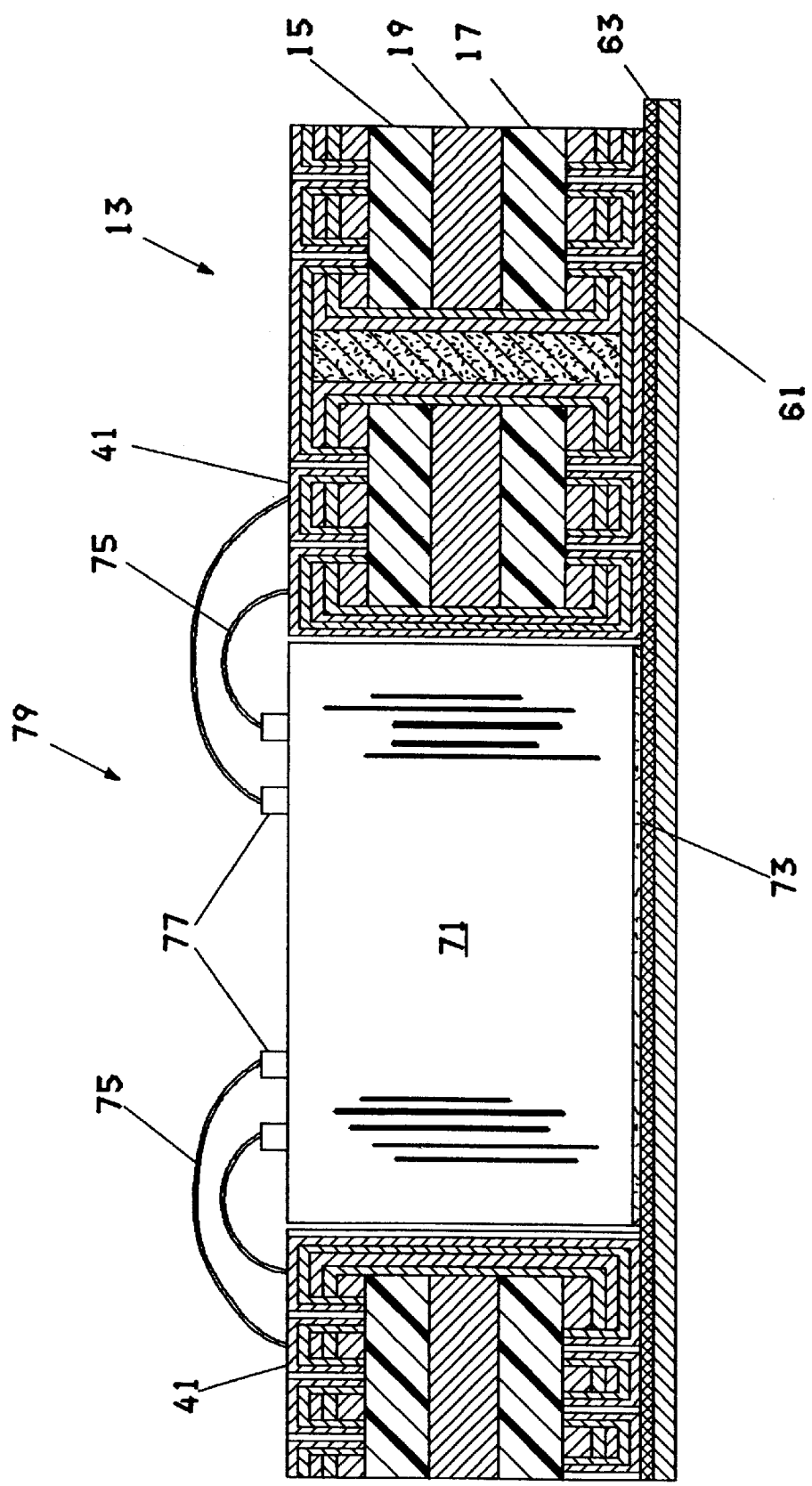

The member 13 in FIG. 15 is now ready to receive a chip, such as shown in FIG. 16 (the chip represented by the numeral 71). Preferably, chip 71 is bonded to the heat sinking and/or stiffening member 61 using a second adhesive 73, a preferred adhesive being of the thermally conducting type which, in a preferred embodiment, is a commercially available silver-impregnated epoxy sold under the trade designation Ablebond 9651-L by Ablestick Corporation. Chip 71 is thus thermally coupled to member 61 to assure enhance heat removal from the final package structure as produced in accordance with the teachings herein. Bond wires 75 may now be provided to electrically couple contact sites 77 on the chip's upper surface to corresponding respective ones of the conductive members 41 which form the upper layer of circuitry for member 13. As seen in FIG. 16, these wires extend from the chip outwardly to this circuitry. The wires 75 are preferably provided using a wire bond process, well known in the art. Wires 75 can be comprised of gold or aluminum, preferably gold.

If desired, an encapsulant material (not shown) may be provided over the wires and associated pads to provide protection from the occasionally harsh environment in which the product produced by the invention may be exposed. One suitable encapsulant is an epoxy molding material sold by the Dexter-Hysol Company under the product name Hysol 4450.

FIG. 16 thus illustrates a chip carrier structure 79 which is now capable of being electrically coupled to additional circuit structures (e.g., printed circuit boards) which form part of the larger information handling system (computer) for which the product produced by the invention is particularly suited. One such form of coupling may include solder ball attach in which solder balls (e.g., 90:10 lead:tin) are used to couple respective parts of member 13's circuitry to the circuitry on one/more of such additional circuit structures. Other techniques are of course readily possible for achieving this end.

Thus there have been shown and described a facile method for producing a circuitized substrate for use as part of a chip carrier assembly which is capable of being readily performed using many established processes of the art. The invention thus represents a relatively inexpensive yet effective process for producing chip carrier structures on a mass scale. While the invention has been described with respect to organic dielectric materials, this is not meant to limit the invention in that even inorganic (e.g., ceramic) may be utilized to provide the dielectric function. As stated above, it is also readily possible to utilize alternative procedures (e.g., additive circuitization) which are also known in the art, to accomplish the invention.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising the steps of:

providing an electrically insulative base member having first and second surfaces and at least one contact hole extending entirely therethrough, said contact hole having at least one sidewall;

removing a preselected portion of said base member to form at least one aperture having at least one sidewall extending entirely through said base member, said aperture defining boundaries of an opening within said insulative base member such that said insulative base member can, subsequently accommodate a chip positioned in said opening;

applying a first electrically conductive layer onto said first and second surfaces of said base member, including on said at least one sidewall of said aperture and on said at least one sidewall of said contact hole;

applying a second electrically conductive layer onto said first electrically conductive layer to substantially cover said first electrically conductive layer;

applying photoimageable material onto said second conductive layer;

exposing and developing selected portions of said photoimageable material to define a pattern within said photoimageable material on said second conductive layer;

circuitizing said second conductive layer; and removing said photoimageable material from said second conductive layer.

2. The method of claim 1 wherein said preselected portion of said base member is removed using a routing process.

3. The method of claim 1 wherein said applying of said first conductive material onto said first and second surfaces and on said at least one sidewall of said aperture comprises depositing a palladium-tin colloid.

4. The method of claim 1 wherein said applying said second conductive layer onto said first conductive layer is accomplished using a plating process.

5. The method of claim 4 wherein said plating process is an additive plating process.

6. The method of claim 1 wherein said exposing and developing said selected portions of said photoimaging material is accomplished using a masking process.

7. The method of claim 1 further including the step of applying precious metal material onto selected regions of said circuitized second conductive layer after said circuitizing step.

8. The method of claim 1 further including securing a heat sinking and/or stiffener member to said base member along said second surface.

9. The method of claim 8 wherein said securing of said heat sinking and/or stiffener member is accomplished using an adhesive.

10. The method of claim 8 further including the step of positioning an integrated circuit member within said aperture extending through said base member.

11. The method of claim 10 further including positioning said integrated circuit member on said heat sinking and/or stiffener member.

12. The method of claim 10 further including the step of electrically coupling said integrated circuit member to the circuitry formed as a result of said circuitizing of said second electrically conductive layer and said first electrically conductive layer on said first surface of said base member.

13. The method of claim 12 wherein said electrical coupling is accomplished using a wire bonding process.

* * * * *